United States Patent
Sanematsu

(10) Patent No.: US 9,119,284 B2
(45) Date of Patent: Aug. 25, 2015

(54) PLASMA GENERATOR AND METHOD FOR PRODUCING RADICAL, AND CLEANING AND PURIFYING APPARATUS AND SMALL-SIZED ELECTRICAL APPLIANCE USING THE SAME

(75) Inventor: Wataru Sanematsu, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 223 days.

(21) Appl. No.: 13/807,621

(22) PCT Filed: Jun. 13, 2011

(86) PCT No.: PCT/JP2011/063455
§ 371 (c)(1),
(2), (4) Date: Dec. 28, 2012

(87) PCT Pub. No.: WO2012/011332
PCT Pub. Date: Jan. 26, 2012

(65) Prior Publication Data
US 2013/0098753 A1   Apr. 25, 2013

(30) Foreign Application Priority Data

Jul. 21, 2010   (JP) .................................. 2010-163658
Feb. 8, 2011   (JP) .................................. 2011-024937

(51) Int. Cl.
*B01J 19/08*   (2006.01)
*H05H 1/48*   (2006.01)
(Continued)

(52) U.S. Cl.
CPC ................. *H05H 1/48* (2013.01); *A45D 27/46* (2013.01); *B08B 3/10* (2013.01); *B08B 7/00* (2013.01);
(Continued)

(58) Field of Classification Search
CPC .............. A61L 2/14; C02F 1/28; C02F 1/72; H01J 37/32082; H01J 37/32091; B08B 3/10; H05H 1/48; H05H 1/2406; C01B 13/11; A45D 27/46; A45D 27/48
See application file for complete search history.

(56) References Cited

U.S. PATENT DOCUMENTS

| 5,876,663 A | 3/1999 | Laroussi |
| 6,328,898 B1 | 12/2001 | Akiyama et al. |
| 2004/0245087 A1 | 12/2004 | Lee |

FOREIGN PATENT DOCUMENTS

| CN | 1513772 A | 7/2004 |
| JP | 2001-009463 A | 1/2001 |

(Continued)

OTHER PUBLICATIONS

Search Report issued in Chinese Application No. 201180032218X dated Aug. 19, 2014, with English Translation.

(Continued)

*Primary Examiner* — Xiuyu Tai
(74) *Attorney, Agent, or Firm* — McDermott Will & Emery LLP

(57) ABSTRACT

A plasma generator 1 includes a first electrode 12 provided in a gas storage section 5, and a second electrode 13 provided in such a manner that at least a portion coupled with the first electrode 12 comes into contact with a liquid 17 in a liquid storage section 4. Electrical discharge is caused between the first electrode 12 and the second electrode 13 so that plasma is produced in a gas region in the liquid 17 in the liquid storage section 4, and hydroxyl radical is produced from water contained in the liquid 17 and oxygen contained in the gas.

11 Claims, 10 Drawing Sheets

(51) Int. Cl.
   *B08B 7/00* (2006.01)
   *C02F 1/72* (2006.01)
   *C02F 1/78* (2006.01)
   *H01J 37/32* (2006.01)
   *B08B 3/10* (2006.01)
   *H05H 1/24* (2006.01)
   *C01B 13/11* (2006.01)
   *A45D 27/46* (2006.01)
   *H05H 1/46* (2006.01)
   *A45D 27/48* (2006.01)

(52) U.S. Cl.
   CPC . *C01B 13/11* (2013.01); *C02F 1/72* (2013.01); *C02F 1/78* (2013.01); *H01J 37/32082* (2013.01); *H01J 37/32091* (2013.01); *H05H 1/2406* (2013.01); *A45D 27/48* (2013.01); *C01B 2201/60* (2013.01); *C01B 2201/64* (2013.01); *C02F 2305/02* (2013.01); *H05H 2001/2412* (2013.01); *H05H 2001/466* (2013.01)

(56) References Cited

FOREIGN PATENT DOCUMENTS

| JP | 2002-126769 A | 5/2002 |
|----|---------------|--------|
| JP | 2004-268003 A | 9/2004 |
| JP | 2008-178870 A | 8/2008 |
| WO | WO-2007/063987 A1 | 6/2007 |
| WO | WO-2007/105330 A1 | 9/2007 |

OTHER PUBLICATIONS

International Search Report mailed Sep. 13, 2011 issued in corresponding International Application No. PCT/JP2011/063455.

PLASMA GENERATOR AND METHOD FOR PRODUCING RADICAL, AND CLEANING AND PURIFYING APPARATUS AND SMALL-SIZED ELECTRICAL APPLIANCE USING THE SAME

RELATED APPLICATIONS

This application is the U.S. National Phase under 35 U.S.C. §371 of International Application No. PCT/JP2011/063455, filed on Jun. 13, 2011, which in turn claims the benefit of Japanese Application No. 2010-163658, filed on Jul. 21, 2010, and Japanese Application No. 2011-024937, filed on Feb. 8, 2011, the disclosures of which Applications are incorporated by reference herein.

TECHNICAL FIELD

The present invention relates to a plasma generator and a method for producing a radical, and a cleaning and purifying apparatus and a small-sized electrical appliance using the same.

BACKGROUND ART

There have been known methods to produce a radical and the like in gas bubbles contained in a liquid by causing electrical discharge in the liquid so as to reform the liquid (for example, refer to Patent Document 1).

CITATION LIST

Patent Literature

Patent Document 1: Japanese Patent Unexamined Publication No. 2001-009463

SUMMARY OF INVENTION

However, electrical resistance in the liquid is significantly changed because of the components contained in various types of impurities contained in the liquid to be treated. Therefore, the conventional methods described above by use of the electrical discharge in the liquid cannot produce plasma stably since the electrical discharge might be caused unequally even if a predetermined voltage was applied to the electrodes. In other words, the amount of the radical and the like produced, might vary when using the conventional methods described above.

It is an object of the present invention to obtain a plasma generator capable of producing a radical quite stably and a method for producing the radical, and a cleaning and purifying apparatus and a small-sized electrical appliance using the same.

A plasma generator according to the present invention includes: a liquid storage section that stores a liquid containing water; a gas storage section that stores a gas; a partition provided with a gas passage to introduce the gas in the gas storage section into the liquid storage section and separating the liquid storage section from the gas storage section; a first electrode provided in the gas storage section; a second electrode separated from the first electrode and provided in such a manner that at least a portion coupled with the first electrode comes into contact with the liquid in the liquid storage section; a gas supply unit that supplies a gas containing oxygen to the gas storage section so that the gas in the gas storage section is delivered under pressure into the liquid storage section via the gas passage; and a plasma power source that applies a predetermined voltage between the first electrode and the second electrode to cause electrical discharge between the first electrode and the second electrode, thereby converting the gas introduced into the gas storage section into plasma.

A method for producing a radical of the present invention includes: separating a liquid storage section that stores a liquid containing water from a gas storage section that stores a gas by a partition provided with a gas passage that allows the gas to flow therethrough, and supplying a gas containing oxygen to the gas storage section so as to deliver the gas in the gas storage section under pressure to the liquid storage section via the gas passage; developing gas bubbles containing oxygen at an opening end of the gas passage in the liquid storage section; and generating plasma in a gas region in the liquid in the liquid storage section, thereby producing hydroxyl radical from the water contained in the liquid and the oxygen contained in the gas.

A cleaning and purifying apparatus of the present invention includes: the plasma generator described above; a gas introduction passage fixed to the gas storage section to supply a gas to the gas storage section; a liquid introduction passage for introducing a liquid to the liquid storage section, and a liquid discharge passage for discharging the liquid in the liquid storage section, the liquid introduction passage and the liquid discharge passage being fixed to the liquid storage section; and a function to supply the gas from the gas introduction passage to deliver the gas in the gas storage section under pressure to the liquid storage section via the gas passage so as to release gas bubbles containing hydroxyl radical into the liquid.

A small-sized appliance of the present invention includes the plasma generator described above or the cleaning and purifying apparatus described above.

In the plasma generator according to the present invention, the first electrode is provided in the gas storage section, and the second electrode is provided in such a manner that at least the portion coupled with the first electrode comes into contact with the liquid in the liquid storage section.

In the method for producing the radical according to the present invention, the electrical discharge is caused between the first electrode and the second electrode, so that the plasma is produced in the gas region in the liquid in the liquid storage section, and the hydroxyl radical is produced from water contained in the liquid and oxygen contained in the gas.

According to the configuration and the method described above, since the electrical discharge can be caused between the first electrode and the second electrode without being influenced largely by the electrical resistance of the liquid, the gas can be converted into the plasma more reliably and accordingly, it is possible to produce a large amount of the radical more stably.

Accordingly, it is possible to obtain the cleaning and purifying apparatus and the small-sized electrical appliance capable of producing the radical, quite stably by providing the plasma generator described above in the cleaning and purifying apparatus and the small electrical appliance.

DESCRIPTION OF EMBODIMENTS

Figure 1:
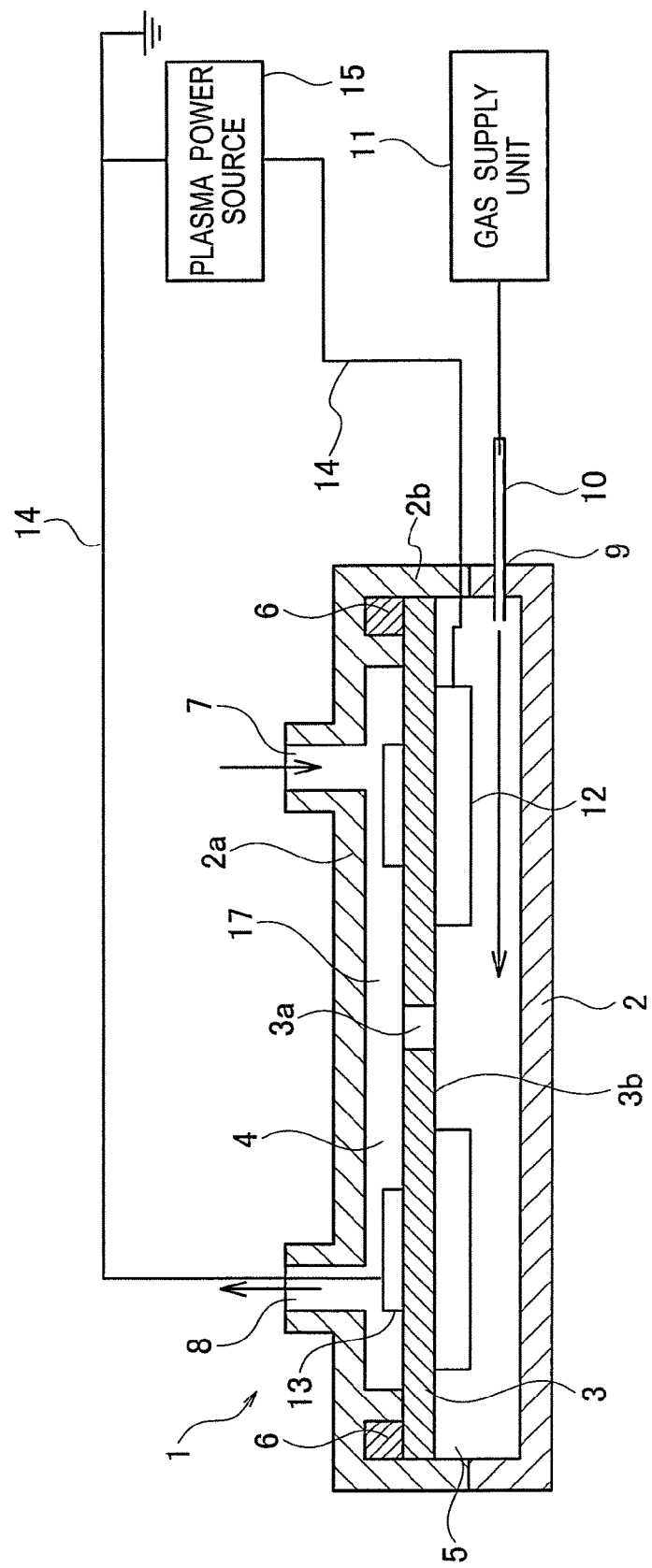
FIG. 1 is a view including a partial cross-section schematically showing a configuration of a plasma generator according to a first embodiment of the present invention.

Hereinafter, embodiments according to the present invention will be explained with reference to the drawings. Note that identical elements are included in the respective embodiments described below. Therefore, the identical elements are indicated by the common reference numerals, and the overlapping explanations thereof are not repeated.

First Embodiment

A plasma generator 1 according to the present embodiment includes a case member 2 formed approximately in a cylindrical shape. Note that the case member is not limited to the cylindrical shape, and may be formed in a prism.

As shown in FIG. 1, a ceramic member 3 is provided inside the case member 2 to divide the case member 2 into an upper area and a lower area.

In the present embodiment, the upper area in the inner space of the case member 2 divided by the ceramic member 3 serves as a liquid storage section 4 to store a liquid 17 containing water, and the lower area serves as a gas storage section 5 to store a gas.

As described above, according to the present embodiment, the ceramic member 3 serves as a partition to separate the liquid storage section 4 from the gas storage section 5.

A ring-shaped sealing member 6 is attached along the periphery of the liquid storage section 4 to seal a gap between the case member 2 and the ceramic member 3. Accordingly, the liquid 17 in the liquid storage section 4 is prevented from leaking from the gap between the case member 2 and the ceramic member 3 into the gas storage section 5.

A liquid inlet 7 is provided on an upper wall (a wall on the liquid storage section 4 side) 2a of the case member 2 to introduce the liquid 17 into the liquid storage section 4. In addition, a liquid outlet 8 is provided on the upper wall 2a to discharge the liquid 17 introduced into the liquid storage section 4 to the outside.

A gas inlet 9 is provided at the bottom of a side wall 2b of the case member 2 so that the gas storage section 5 communicates with the outside. A pipe (a gas introduction passage) 10 is inserted into the gas inlet 9. The gas storage section 5 and a gas supply unit 11 are connected to each other via the pipe 10. In the present embodiment, a gas containing at least oxygen (O2) is supplied to the gas storage section 5 from the gas supply unit 11.

The ceramic member 3 is provided with a gas passage 3a, through which the gas introduced from the gas supply unit 11 into the gas storage section 5 is delivered to the liquid storage section 4.

Thus, the gas supply unit 11 according to the present embodiment functions to supply the gas containing at least oxygen to the gas storage section 5 so that the gas in the gas storage section 5 is delivered under pressure to the liquid storage section 4 via the gas passage 3a.

In the present embodiment, a hole diameter of the gas passage 3a is set approximately in a range from 1 μm to 10 μm so as to be sufficiently small to prevent the liquid 17 stored in the liquid storage section 4 from leaking from the gas passage 3a into the gas storage section 5.

The plasma generator 1 includes a first electrode 12 provided in the gas storage section 5, and a second electrode 13 separated from the first electrode 12 and provided in such a manner that at least a portion coupled with the first electrode 12 (a surface of the second electrode 13 arranged to generate electrical discharge to a surface of the first electrode 12) comes into contact with the liquid 17 in the liquid storage section 4.

In particular, the doughnut-shaped first electrode 12 and the doughnut-shaped second electrode 13 are provided in the gas storage section 5 and in the liquid storage section 4, respectively.

As shown in FIG. 1, the doughnut-shaped first electrode 12 is provided on a surface 3b of the ceramic member 3 on the gas storage section 5 side, and is positioned so as to have its center located on the gas passage 3a. The surface of the first electrode 12 is covered with a dielectric material (not shown in the figure).

The second electrode 13 is provided in the liquid storage section 4 in such a manner that at least the portion coupled with the first electrode 12 (the surface of the second electrode 13 arranged to generate electrical discharge to a surface of the first electrode 12) comes into contact with the liquid 17 in the liquid storage section 4. The second electrode 13 is also positioned so as to have its center located on the gas passage 3a. That is, the first electrode 12 and the second electrode 13 are arranged in a concentric pattern.

In the plasma generator 1 according to the present embodiment, the doughnut-shaped first electrode 12 is provided in the gas storage section 5 so that the first electrode 12 is prevented from coming into contact with the liquid 17 introduced into the liquid storage section 4.

In contrast, the doughnut-shaped second electrode 13 is provided in the liquid storage section 4 in such a manner that at least the portion coupled with the first electrode 12 (the surface of the second electrode 13 arranged to generate electrical discharge to a surface of the first electrode 12) comes into contact with the liquid 17 introduced into the liquid storage section 4.

The first electrode 12 and the second electrode 13 are electrically connected to a plasma power source 15 via leads 14, respectively (refer to FIG. 1), so that a predetermined voltage is applied between the first electrode 12 and the second electrode 13.

Figure 2:
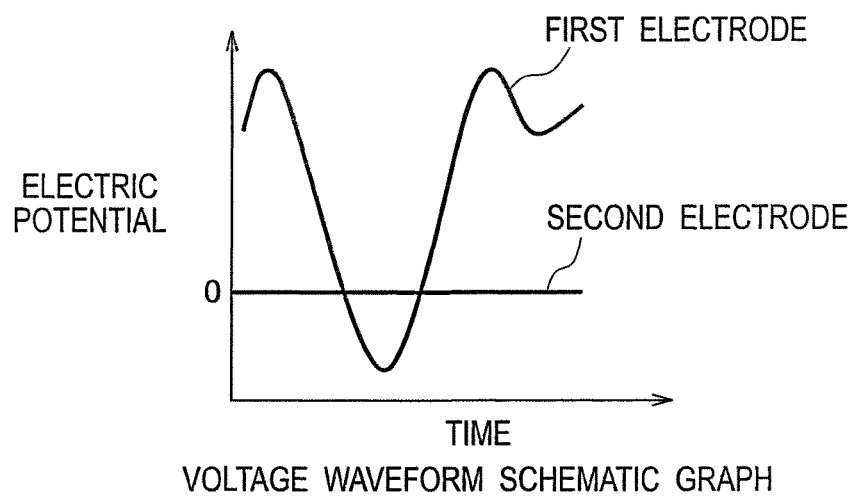
FIG. 2 is a graph showing a level of a voltage applied to a first electrode and a second electrode of the plasma generator according to the first embodiment of the present invention.

In the present embodiment, as shown in FIG. 1 and FIG. 2, the predetermined voltage is applied between the first electrode 12 and the second electrode 13 while the second electrode 13 is grounded.

Next, a performance of the plasma generator 1 and a method for producing hydroxyl radical are explained.

First, a gas containing oxygen is supplied to the gas storage section 5 so that the gas in the gas storage section 5 is delivered under pressure to the liquid storage section 4 via the gas passage 3a (a step of supplying a gas).

In the present embodiment, as shown in FIG. 1, the gas based on air and containing oxygen (a flow rate is approximately from 0.01 L/min to 1.0 L/min (from 10 cc/min to 1000 cc/min)) is delivered from the gas supply unit 11 to the gas storage section 5 via the pipe 10. In this case, the pressure used to deliver the gas is set approximately in a range from 0.0098 MPa to 0.49 MPa (from 0.1 kgf/cm2 to 5 kgf/cm2).

As described above, the gas supply unit 11 functions to supply the gas (air) in the atmosphere. Here, the flow rate of the gas supplied is controlled by a flow rate controller provided in the gas supply unit 11. Alternatively, the gas supply unit 11 may function to supply several types of gas (for example, gases having different oxygen concentrations) in addition to the gas in the atmosphere, and may be provided with a gas type regulator to selectively supply one of or some of the several types of gas.

When the gas is supplied to the gas storage section 5, the pressure in the gas storage section 5 is changed approximately to a range from 0.11 MPa to 0.59 MPa (from 1.1 kgf/cm2 to 6 kgf/cm2) due to the increased pressure (in addition to the atmospheric pressure), whereby the gas storage section 5 is in a state of a positive pressure. Due to the gas storage section 5 being under the positive pressure, a flow of the gas from the gas storage section 5 toward the liquid storage section 4 through the gas passage 3a is generated. Even when the gas storage section 5 is under the positive pressure, the liquid 17 stored in the liquid storage section 4 is prevented from leaking into the gas storage section 5 through the gas passage 3a.

When the gas containing oxygen is supplied to the gas storage section 5 as described above, as shown in FIG. 3, gas bubbles 16 containing oxygen are developed at an opening end 3c of the gas passage 3a on the liquid storage section 4 side (the upper side in FIG. 1) (a step of developing gas bubbles).

Then, a predetermined voltage is applied to the first electrode 12 and the second electrode 13 by the plasma power source 15. The voltage is preferably capable of glow discharge under atmospheric pressure (power: approximately from 10 W to 100 W). In this case, it is preferable to provide a voltage controller in the plasma power source 15 to control the voltage applied between the first electrode 12 and the second electrode 13.

Once the predetermined voltage is applied to the first electrode 12 and the second electrode 13, electrical discharge is caused between the first electrode 12 and the second electrode 13 in a gas atmosphere under atmospheric pressure or higher. Note that a method for producing plasma under atmospheric pressure has been reported in, for example, Document A (Satiko Okazaki, "Atmospheric Pressure Glow Discharge Plasma and Its Applications", Review Speech: 20th JSPF Annual Meeting).

Due to the electrical discharge, plasma is produced in a gas region in the liquid 17 in the liquid storage section 4, and ozone and hydroxyl radical are produced from water contained in the liquid or oxygen contained in the gas (a step of producing hydroxyl radical).

According to the present embodiment, the plasma is generated by a potential difference caused in the gas inside the gas bubbles 16 (the gas adjacent to a gas-liquid boundary in the liquid 17 in the liquid storage section 4). Since the potential difference is caused adjacent to the gas-liquid boundary (adjacent to the opening end 3c of the gas passage 3a facing the liquid 17) where the hydroxyl radical is easily produced, it is possible to produce a larger amount of the ozone and hydroxyl radical. Note that, in the present embodiment, it is possible to produce the ozone and hydroxyl radical even in the gas bubbles 16 delivered into the liquid storage section 4 in addition to the gas bubbles 16 around the opening end 3c of the gas passage 3a facing the liquid 17.

The ozone and hydroxyl radical produced as described above are delivered to the liquid storage section 4 as a result of the gas flow described above.

According to the present embodiment, the gas bubbles 16 containing the hydroxyl radical and the like are separated from the ceramic member (the partition) 3 and then released into the liquid 17 by the flow of the liquid 17 in the liquid storage section 4 (a step of releasing gas bubbles).

Figure 3:
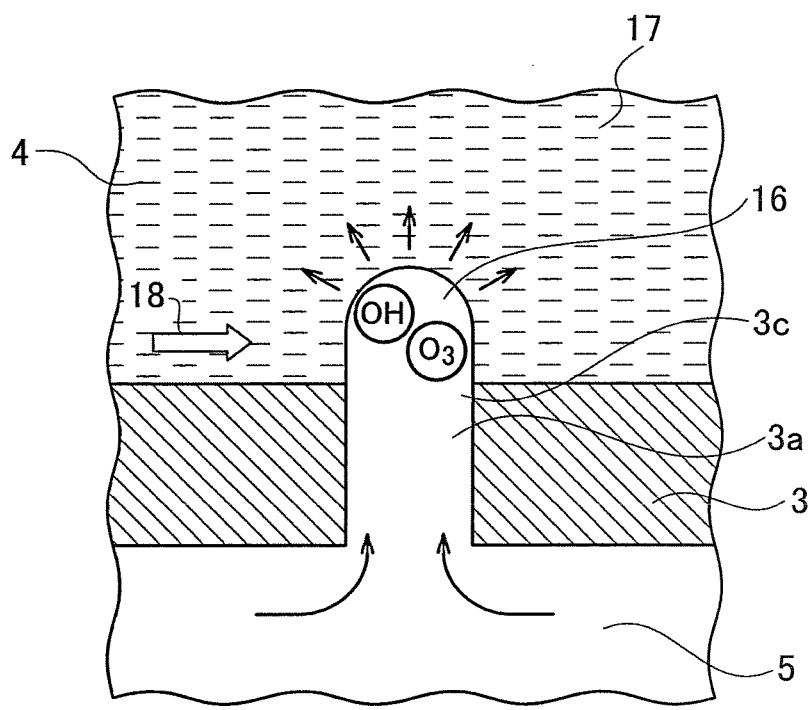
FIG. 3 is a partially enlarged cross-sectional view schematically showing a particular situation to explain a performance of the plasma generator according to the first embodiment of the present invention.
Figure 4:
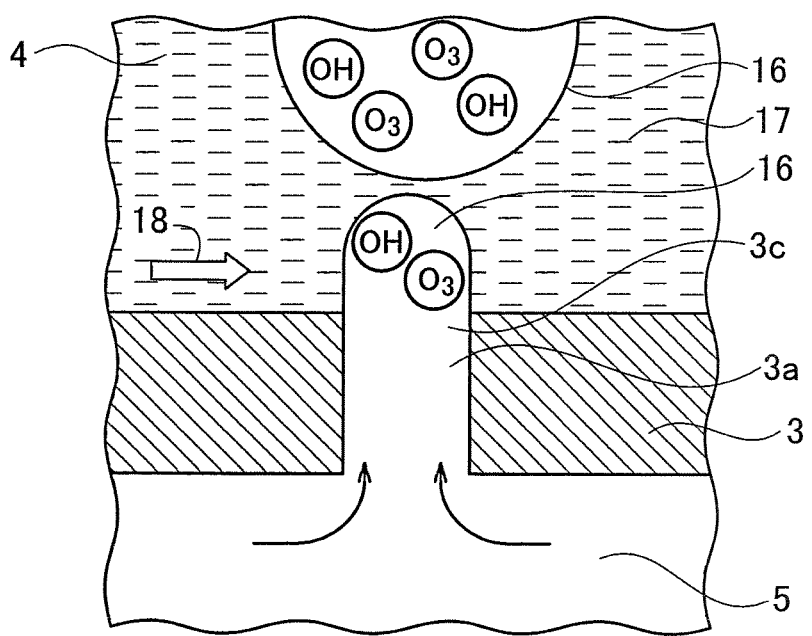
FIG. 4 is a partially enlarged cross-sectional view schematically showing a situation after the situation shown in FIG. 3.

In particular, the flow of the liquid 17 is generated in the liquid storage section 4 where the gas bubbles 16 are developed due to the introduction of the liquid 17 (refer to an arrow 18 in FIG. 3 and FIG. 4). As shown in FIG. 4, when the liquid 17 flowing in the direction of the arrow 18 hits the gas bubbles 16 being developed, the gas bubbles 16 are subjected to a separation force because of the flow of the liquid 17 and thereby released into the liquid 17 from the opening end 3c.

Since the gas bubbles 16 released into the liquid 17 are fine gas bubbles, the released gas bubbles 16 are dispersed in the liquid 17 in all directions without being emitted immediately into the atmosphere. Part of the dispersed fine gas bubbles 16 is easily dissolved in the liquid 17. At this point, the ozone contained in the gas bubbles 16 is dissolved into the liquid 17 and as a result, an ozone concentration in the liquid 17 is immediately increased.

According to Document B (Masayoshi Takahashi, "Improvement in Aquatic Environment by Microbubbles and Nanobubbles"; Aquanet, 2004. 6), it is reported that the fine gas bubbles 16 containing the ozone and several types of radicals generally tend to be negatively-charged. Therefore, part of the gas bubbles 16 is easily adsorbed by materials such as organic substances, oil and fat substances, dyes, proteins and bacteria (not shown in the figures) contained in the liquid 17. The organic substances and the like in the liquid 17 are resolved by the ozone or several types of radicals dissolved in the liquid 17, or by the ozone or several types of radicals contained in the gas bubbles 16 adsorbed by the organic substances and the like.

For example, the hydroxyl radical has relatively high energy of approximately 120 kcal/mol. Such energy exceeds bond energy (up to 100 kcal/mol) of a double bond between nitrogen atoms (N=N), a double bond between carbon atoms (C=C), a double bond between a nitrogen atom and a carbon atom (N=C) or the like. Therefore, the organic substances produced by bonding of nitrogen and/or carbon are resolved since the bonding in the organic substances is easily broken by the hydroxyl radical. Here, the ozone and hydroxyl radical contributing to such a resolution of the organic substances are environmentally-friendly substances since the ozone and hydroxyl radical are not persistent (unlike chlorine and the like) but disappear with time.

As explained above, the plasma generator 1 according to the present embodiment is provided with the first electrode 12 in the gas storage section 5, and provided with the second electrode 13 in such a manner that at least the portion coupled with the first electrode 12 (the surface of the second electrode 13 arranged to generate electrical discharge to a surface of the first electrode 12) comes into contact with the liquid 17 in the liquid storage section 4.

The plasma is produced in the gas region inside the liquid 17 in the liquid storage section 4 by causing the electrical discharge between the surface of the first electrode 12 coming into contact with the gas and the surface of the second electrode 13 coming into contact with the liquid, thereby producing the hydroxyl radical from water contained in the liquid 17 and oxygen contained in the gas.

According to the configuration and the method described above, the electrical discharge can be caused between the first electrode 12 and the second electrode 13 without being influenced largely by the electrical resistance of the liquid 17 and therefore, the gas can be converted into plasma more reliably. Accordingly, it is possible to produce a large amount of the ozone and radical more stably.

According to the present embodiment, the predetermined voltage is applied between the first electrode 12 and the second electrode 13 while the second electrode 13 is grounded. Therefore, even in the case where a user accidentally touches the liquid or the second electrode, it is possible to protect the user from electrical shock.

Thus, the safety in the plasma generator according to the present embodiment can be further improved.

According to the present embodiment, the liquid 17 is introduced into the liquid storage section 4, and the first electrode 12 for producing the plasma is provided in the gas storage section 5 that is defined by the ceramic member 3. Therefore, the first electrode 12 does not come into contact with the liquid 17 at all so as not to be influenced by the electrical resistance of the liquid 17. As a result, it is possible to cause the electrical discharge between the first electrode 12 and the second electrode 13 stably. Further, it is possible to produce the ozone and hydroxyl radical from water and oxygen stably since the gas containing oxygen introduced into the gas storage section 5 is converted into plasma reliably.

According to the present embodiment, the gas containing oxygen is introduced into the gas storage section 5, whereby the gas storage section 5 is in the state of the positive pressure, and the flow of the gas from the gas storage section 5 toward the liquid storage section 4 through the gas passage 3a is generated. The ozone and hydroxyl radical are produced inside the gas bubbles 16 developed at the opening end 3c of the gas passage 3c facing the liquid 17 in association with the gas flow. The gas bubbles 16 developed to a particular size are separated from the opening end 3c by the flow of the liquid 17 and then released into the liquid 17.

Namely, in the present embodiment, the ozone and hydroxyl radical are produced in the gas inside the gas bubbles 16 (the gas adjacent to the gas-liquid boundary in the liquid 17 in the liquid storage section 4). The gas containing the ozone and hydroxyl radical is dispersed as the fine gas bubbles 16 in the liquid 17 in all directions. Accordingly, after the production of the ozone and several types of radicals, it is possible to deliver the ozone and several types of radicals into the liquid efficiently and in quite a short time before the disappearance of the ozone and several types of radicals.

Since the fine gas bubbles 16 containing the ozone and several types of radicals are dispersed in the liquid 17 in all directions, the ozone concentration in the liquid 17 is increased, and the gas bubbles 16 are adsorbed by the organic substances contained in the liquid 17. As a result, it is possible to resolve the organic substances or bacteria efficiently by the ozone dissolved in the liquid 17 and the several types of radicals contained in the gas bubbles 16 adsorbed by the organic substances and the like.

Further, since the first electrode 12 and the second electrode 13 that produce the plasma are formed into a doughnut shape, the entire size of the plasma generator 1 excluding the plasma power source 15 and the gas supply unit 11 can be reduced. Consequently, the plasma generator 1 can be easily installed in existing apparatuses. In addition, it is possible to minimize a space occupied by the plasma generator 1 even when installing in new apparatuses.

Further, it is possible to cause the electrical discharge stably regardless of variations of the electrical resistance of the liquid 17 caused between the first electrode 12 and the second electrode 13, as long as the plasma power source 15 is provided with the voltage controller to control the voltage applied between the first electrode 12 and the second electrode 13.

In the case where the gas supply unit 11 includes the gas type regulator to regulate the type of the gas, it is possible to adjust the amount of the ozone and hydroxyl radical produced.

It is possible to supply the gas more easily if the gas supply unit 11 functions to supply air in the atmosphere.

Further, it is possible to produce the plasma more stably if the flow rate controller controls the flow rate of the gas supplied.

Second Embodiment

In the present embodiment, an example of a cleaning and purifying apparatus using the plasma generator 1 will be explained.

A cleaning and purifying apparatus 20 according to the present embodiment includes the plasma generator 1 described above as shown in FIG. 5. In the cleaning and purifying apparatus 20, a pipe (a liquid introduction passage) 21 to introduce the treated liquid 17 from a cleaning treatment target section 30 into the liquid storage section 4 is connected to the liquid inlet 7 of the case member 2 that houses the ceramic member 3. In addition, a pipe (a liquid discharge passage) 22 to deliver the liquid inside the liquid storage section 4 to the cleaning treatment target section 30 is connected to the liquid outlet 8.

Next, a performance of the cleaning and purifying apparatus 20 is explained.

Figure 5:
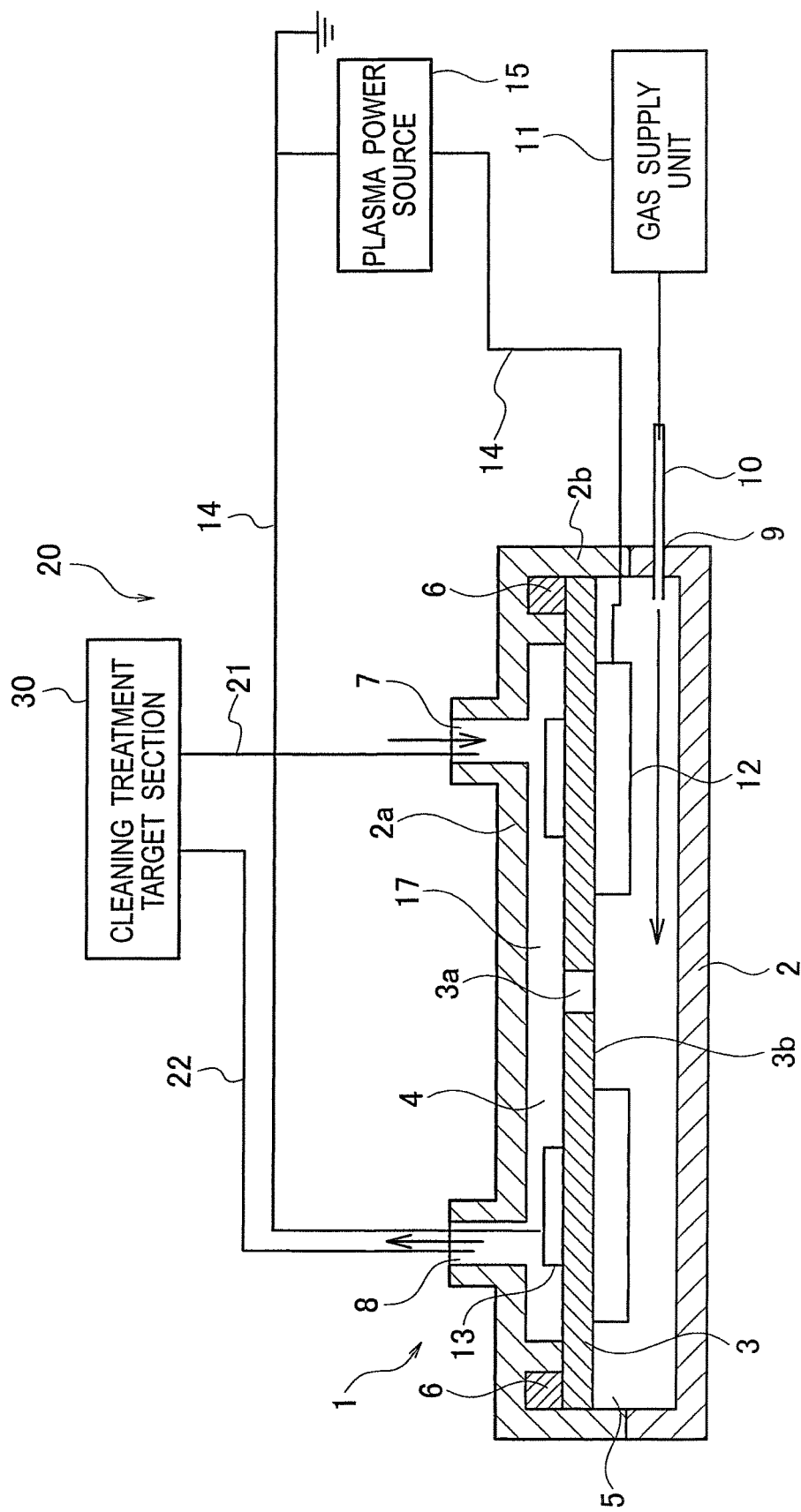
FIG. 5 is a view including a partial cross-section schematically showing a configuration of a cleaning and purifying apparatus according to a second embodiment of the present invention.

As shown in FIG. 5, a gas based on air and containing oxygen and with a predetermined flow rate is delivered from the gas supply unit 11 to the gas storage section 5 via the pipe (the gas introduction passage) 10. Once the gas storage section 5 is shifted to a state of a positive pressure, a flow of the gas from the gas storage section 5 toward the liquid storage section 4 through the gas passage 3c is generated.

At this point, the treated liquid 17 from the cleaning treatment target section 30 is introduced into the liquid storage section 4 from the pipe (the liquid introduction passage) 21 through the liquid inlet 7.

Then, a predetermined voltage is applied between the first electrode 12 and the second electrode 13 while the second electrode 13 is grounded so that electrical discharge is caused between the first electrode 12 and the second electrode 13. Due to the electrical discharge (the discharge caused between the surface of the first electrode 12 coming into contact with the gas and the surface of the second electrode 13 coming into contact with the liquid), plasma is produced in the gas region in the liquid 17 in the liquid storage section 4, and ozone and hydroxyl radical are produced from water contained in the liquid 17 and oxygen contained in the gas (refer to FIG. 4).

The produced ozone and several types of radicals are delivered to the liquid storage section 4 along with the gas flow described above. At this point, the gas bubbles being developed are separated from the opening end 3c by the flow of the liquid 17 as described above, and then released as the fine gas bubbles 16 into the liquid from the opening end 3c.

The fine gas bubbles 16 released into the liquid are dispersed in the liquid in all directions. Part of the dispersed fine gas bubbles 16 is easily dissolved in the liquid 17 together with the ozone and hydroxyl radical contained in the gas bubbles 16, and the ozone concentration is thus increased. In addition, part of the gas bubbles 16 in a state of containing the ozone and hydroxyl radical is easily adsorbed by organic substances and the like contained in the liquid 17. Further, fine organic substances are adsorbed by part of the gas bubbles 16.

As a result, the organic substances in the liquid 17 are resolved efficiently by the ozone or radical dissolved in the liquid 17 or by the ozone or radical contained in the gas bubbles 16 adsorbed by the organic substances. Then, the cleaned liquid 17 in which the organic substances are resolved returns to the cleaning treatment target section 30 from the liquid outlet 8 through the pipe (the liquid discharge passage) 22 so as to be reused.

The cleaning and purifying apparatus 20 described above was exemplified by a usage mode (usage mode A) in which the liquid is cleaned and purified inside the case member 2. Alternatively, another usage mode (usage mode B) in which the liquid 17 containing the fine gas bubbles dispersed therein is supplied to a particular device as a cleaning liquid may be applicable.

In the latter case, the cleaning and purifying apparatus 20 operates as follows.

First, the fine gas bubbles 16 containing the ozone and hydroxyl radical are dispersed in the liquid 17 introduced into the case member 2, and the ozone and hydroxyl radical contained in the fine gas bubbles 16 are dissolved in the liquid 17. At this point, fine organic substances are adsorbed by part of the gas bubbles 16.

Then, the liquid 17 is supplied as a cleaning liquid to the cleaning treatment target section 30. In the cleaning treatment target section 30, the organic substances and the like are efficiently resolved by the ozone or radical dissolved in the liquid 17, or by the ozone or radical contained in the gas bubbles 16 adsorbed by the organic substances.

In the case of using the cleaning and purifying apparatus in the usage mode A, the cleaning and purifying apparatus may be used for the purification of various types of liquids such as warm water from a bathtub, rainwater, foul water and sewage water. In the case of using the cleaning and purifying apparatus in the usage mode B, the liquid 17 may be applied to water as a purifying liquid used for, for example, various types of appliances such as a washing machine and a dishwasher, health appliances such as a mouthwashing device, and sanitary appliances such as a lavatory basin. In addition to these appliances, a wide variety of industrial applications such as washing of food and cleaning of industrial products in manufacturing processes may be possible.

As explained above, in the present embodiment, the cleaning and purifying apparatus 20 is provided with the plasma generator 1. Accordingly, it is possible to obtain the cleaning and purifying apparatus capable of producing the radical quite stably.

Third Embodiment

In the present embodiment, an example of a small-sized appliance using the plasma generator 1 will be explained with reference to FIGS. 6 to 8. Hereinafter, a cleaning and purifying apparatus for cleaning a head unit of an electric shaver as a hair removing device will be exemplified.

Figure 6:
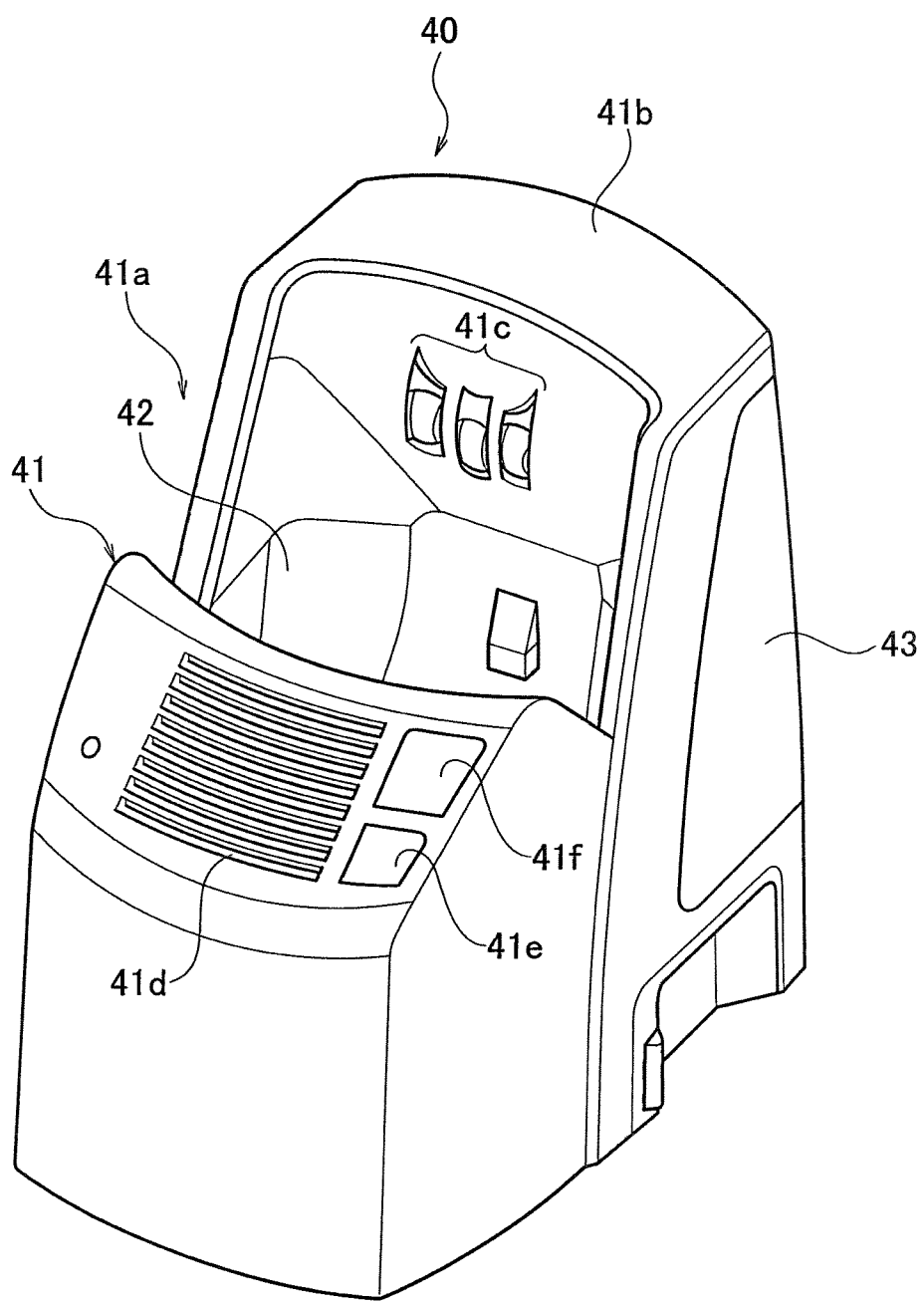
FIG. 6 is a perspective view showing a specific example of a small electrical appliance including a plasma generator according to a third embodiment of the present invention.
Figure 7:
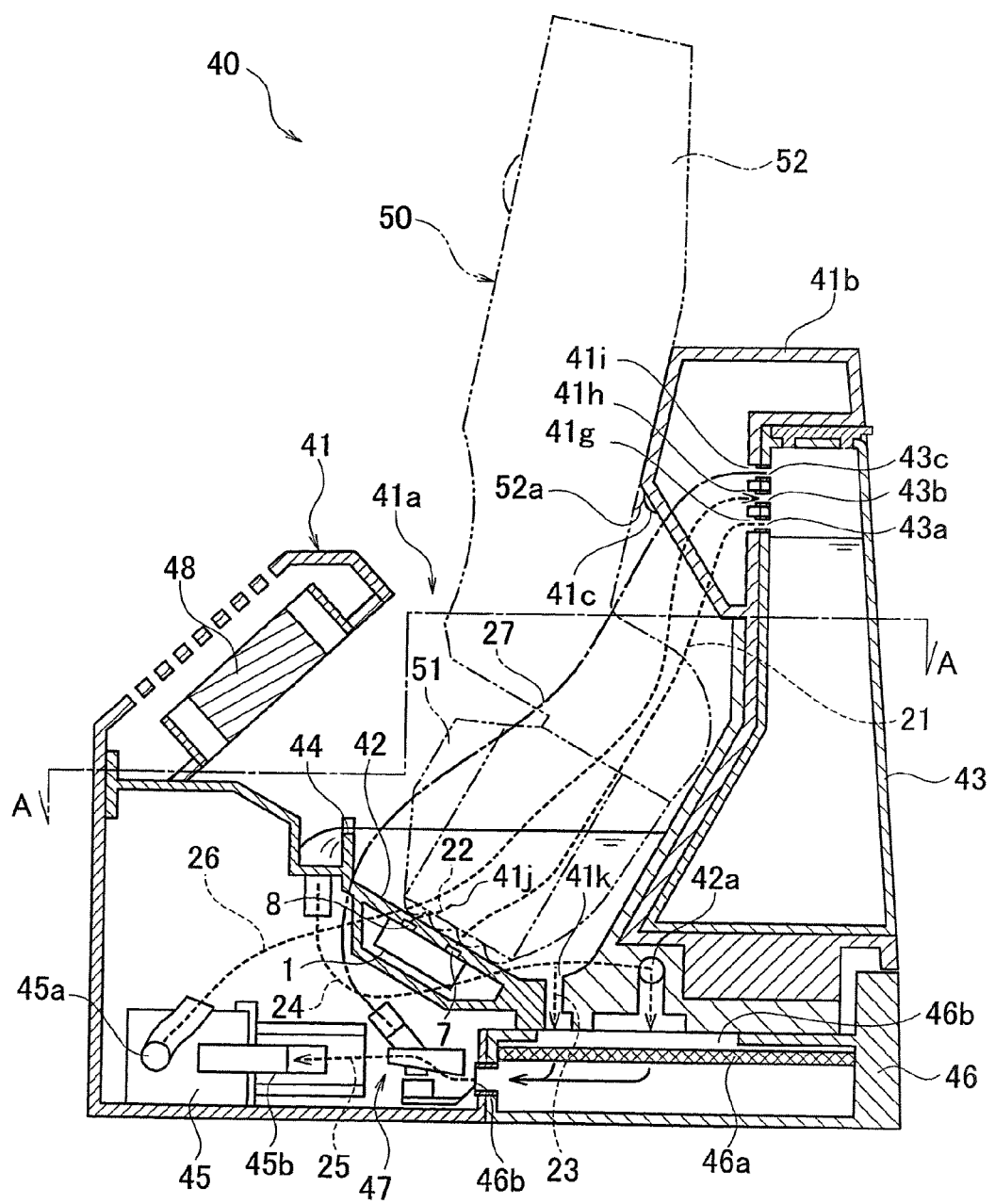
FIG. 7 is a side cross-sectional view of the small electrical appliance shown in FIG. 6.
Figure 8:
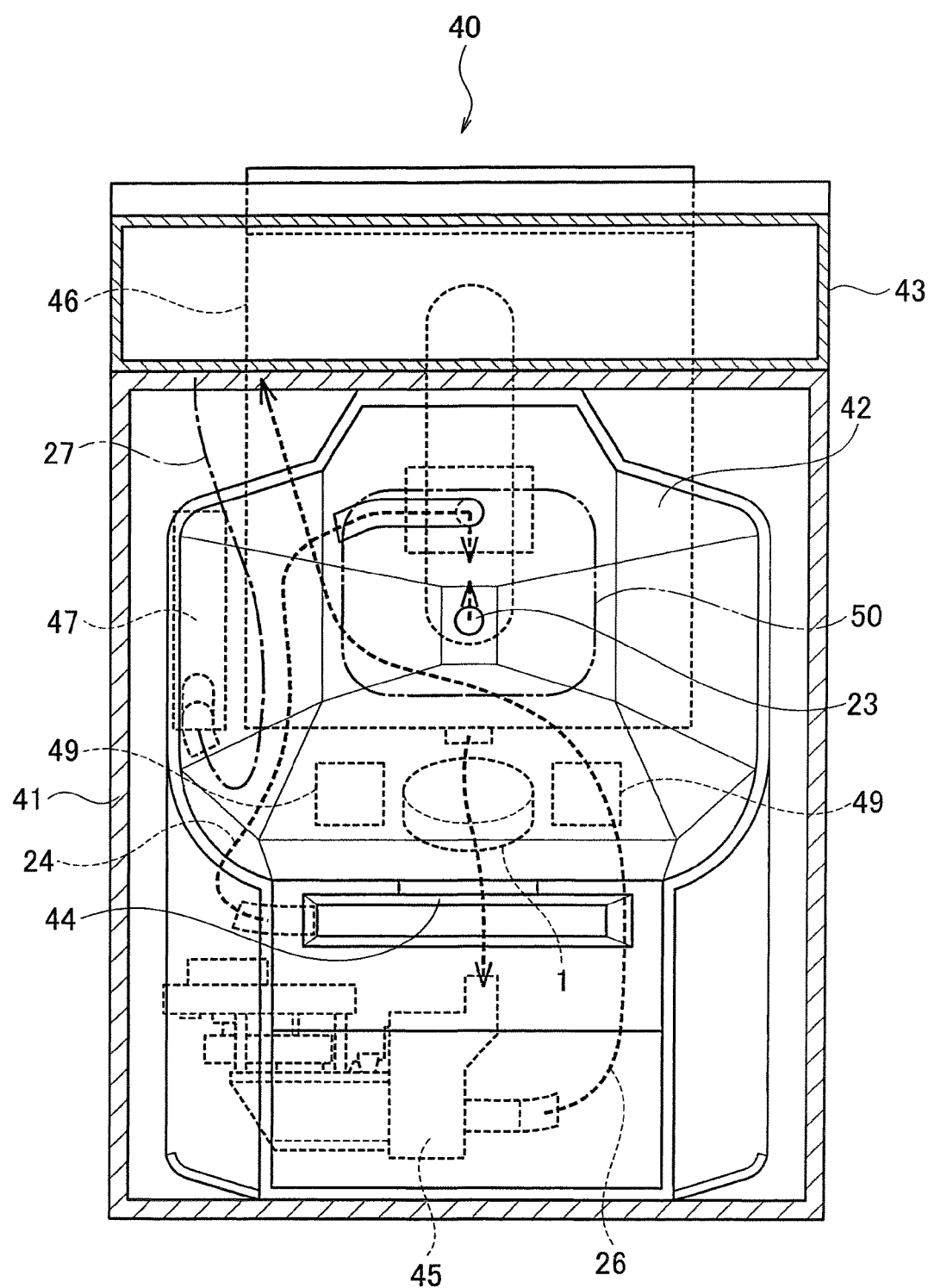
FIG. 8 is a cross-sectional view taken along the line A-A in FIG. 7.

A cleaning and purifying apparatus 40 as a small-sized appliance shown in FIGS. 6 to 8 cleans a head unit 51 of an electric shaver 50 which is a type of hair removing device. The cleaning and purifying apparatus 40 is used in the usage mode B described above. In this case, the head unit 51 of the electric shaver 50 corresponds to the cleaning treatment target section 30.

As shown in FIGS. 6 to 8, the cleaning and purifying apparatus 40 includes a case 41 having an opening 41a through which the electric shaver 50 with the head unit 51 directed downward is inserted, and a receiving plate 42 that receives the head unit 51 inserted via the opening 41a.

In addition, the cleaning and purifying apparatus 40 includes a tank 43 for storing a liquid, an overflow section 44 that communicates with the receiving plate 42, and a pump 45 that cyclically supplies the liquid stored in the tank 43 to the liquid inlet 7. Further, the cleaning and purifying apparatus 40 includes a cartridge 46 having a filter 46a for filtration of the liquid, an opening and closing valve 47 that controls an airtight state inside the tank 43, and a circulation path in which the liquid is circulated.

The circulation path includes the pipe (the liquid introduction passage) 21 for introducing the liquid stored in the tank 43 into the liquid inlet 7, the pipe (the liquid discharge passage) 22 for introducing the liquid discharged from the liquid outlet 8 into the receiving plate 42, a path 23 (a discharge passage) for introducing the liquid discharged from the receiving plate 42 into the cartridge 46, a path 24 for introducing the liquid discharged from the overflow section 44 into the cartridge 46, a path 25 for introducing the liquid discharged from the cartridge 46 into the pump 45, and a path 26 for introducing the liquid delivered from the pump 45 into the tank 43. The opening and closing valve 47 is connected to the tank 43 via an airtight path 27. The following is an explanation with regard to the respective components.

The case 41 is provided with a stand 41b that comes into contact with a grip 52 of the electric shaver 50 at the back side thereof to hold the electric shaver 50 inserted from the opening 41a in contact with the receiving plate 42. As shown in FIG. 6, the stand 41b is provided, on the front surface thereof, with contact members 41c that detect the loading of the electric shaver 50 when a terminal 52a provided on the back surface of the grip 52 comes into contact with the contact members 41c. In addition to such a detecting function, the electric shaver 50 has a function to output several control signals and drive power.

The case 41 houses a fan 48 in a front and upper portion for drying the head unit 51 after cleaning. The case 41 is provided, on the front side thereof, with a ventilation window 41d for the fan 48, an operation button 41e to start a cleaning operation, and a lamp 41f to indicate an operation state. The case 41 is provided with the tank 43 on the back side having connecting ports 41g, 41h and 41i communicating with each port 43a, 43b and 43c of the tank 43. The connecting port 41g is connected to the pipe (the liquid introduction passage) 21, the connecting port 41h is connected to the path 26, and the connecting port 41i is connected to the airtight path 27.

The receiving plate 42 is formed into a concave shape along the shape of the head unit 51. The plasma generator 1 is provided on the back surface of a bottom wall of the receiving plate 42. The cleaning and purifying apparatus 40 may be provided with a position adjuster that adjusts the position of the plasma generator 1. For example, the receiving plate 42 may be provided, on the back side of the bottom wall, with an arm member to which the plasma generator 1 is fixed. The plasma generator 1 is fixed such that it moves freely so that the position adjuster can adjust and maintain the plasma generator 1 in a horizontal position. Accordingly, it is possible to constantly keep the plasma generator 1 in the horizontal position and thereby produce the plasma more stably.

The plasma generator 1 includes the liquid inlet 7 connected to the pipe (the liquid introduction passage) 21, and the liquid outlet 8 connected to the pipe (the liquid discharge passage) 22. The bottom wall of the receiving plate 42 is provided with a supply port 41j connected to the pipe (the liquid discharge passage) 22 and a discharge port 41k connected to the path 23.

Heaters 49 are provided on the back side of the bottom wall of the receiving plate 42 (refer to FIG. 8). The heaters 49 dry the head unit 51 in association with the fan 48.

The overflow section 44 is provided on the front side of the receiving plate 42. The receiving plate 42 and the overflow section 44 are integrally formed in the present embodiment. An inlet of the overflow section 44 is connected to the receiving plate 42, and an outlet of the overflow section 44 is connected to the path 24. The path 24 connects the outlet of the overflow section 44 to the cartridge 46 via a junction port 42a provided on the rear side of the receiving plate 42.

The tank 43 is provided, on the front surface thereof, with the outflow port 43a, the inflow port 43b, and the ventilation port 43c for releasing the tank 43 from the airtight state. The ventilation port 43c opens and closes to control liquid discharge from the outflow port 43a. The tank 43 is detachably provided on the back side of the case 41. In the state of being attached to the case 41, the outflow port 43a is connected to the connecting port 41g to communicate with the liquid inlet 7 of the plasma generator 1 via the pipe (the liquid introduction passage) 21. The inflow port 43b is connected to the connecting port 41h to communicate with a delivery port 45a of the pump 45 via the path 26. The ventilation port 43c is connected to the connecting port 41i to communicate with the opening and closing valve 47 via the airtight path 27.

The cartridge 46 is formed approximately into a box shape that houses the filter 46a therein, and has an inflow port 46b on the upper side and an outflow port 46c on the front side. The cartridge 46 is detachably provided on the bottom and rear side of the case 41. In the state of being attached to the case 41, the inflow port 46b is connected to the discharge port 41k via the path 23 (the discharge passage), and connected to the outlet of the overflow section 44 via the path 24. The outflow port 46c is connected to a suction port 45b of the pump 45 via the path 25.

According to the above-described configuration, a cleaning liquid, which is produced by dispersing the fine gas bubbles 16 containing the ozone and hydroxyl radical into the liquid introduced into the plasma generator 1 from the tank 43, is supplied to the receiving plate 42 from the supply port 41j. Namely, the produced cleaning liquid is supplied to the head unit 51 as the cleaning treatment target section 30. Thus, it is possible to efficiently resolve the organic substances and the like attached to the head unit 51 by the ozone or radical dissolved in the liquid (the cleaning liquid), or by the ozone or radical contained in the gas bubbles 16.

As explained above, according to the present embodiment, the cleaning and purifying apparatus (the small-sized appliance) 40 is provided with the plasma generator 1. Accordingly, the small-sized appliance capable of producing the radical quite stably can be obtained.

It is possible to further stabilize the plasma by providing the position adjuster that adjusts the position of the plasma generator 1 in the cleaning and purifying apparatus 20.

Modified Example of Third Embodiment

A cleaning and purifying apparatus 40A as a small-sized appliance according to the present modified example also cleans the head unit 51 of the electric shaver 50 which is a type of hair removing device, and is used in the usage mode B, as in the case of the third embodiment.

Figure 10:
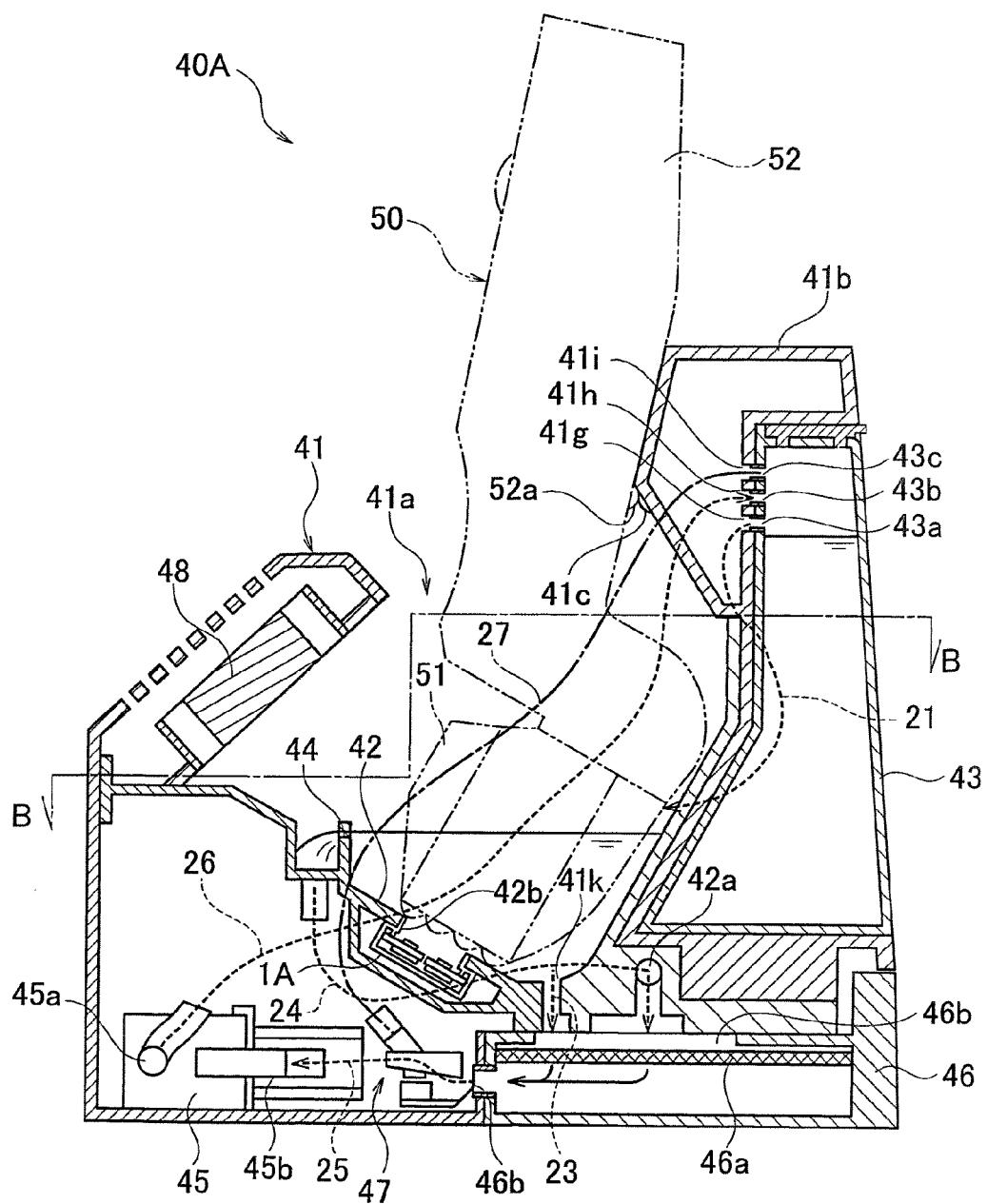
FIG. 10 is a side cross-sectional view showing the small electrical appliance according to the modified example of the third embodiment of the present invention.

The cleaning and purifying apparatus 40A has approximately the same constitution as that in the third embodiment, and includes the case 41 having the opening 41a through which the electric shaver 50 with the head unit 51 directed downward is inserted, and the receiving plate 42 that receives the head unit 51 inserted via the opening 41a (refer to FIG. 10).

In addition, the cleaning and purifying apparatus 40A includes the tank 43 for storing a liquid, the overflow section 44 that communicates with the receiving plate 42, and the pump 45 that cyclically supplies the liquid stored in the tank 43 to the liquid inlet 7. Further, the cleaning and purifying apparatus 40A includes the cartridge 46 having the filter 46a for filtration of the liquid, the opening and closing valve 47 that controls the airtight state inside the tank 43, and the circulation path in which the liquid is circulated.

In the modified example, the circulation path includes the pipe (the liquid introduction passage) 21 for introducing the liquid stored in the tank 43 into the receiving plate 42, the path 23 (the liquid discharge passage) for introducing the liquid discharged from the receiving plate 42 into the cartridge 46, the path 24 for introducing the liquid discharged from the overflow section 44 into the cartridge 46, the path 25 for introducing the liquid discharged from the cartridge 46 into the pump 45, and the path 26 for introducing the liquid delivered from the pump 45 into the tank 43.

Figure 11:
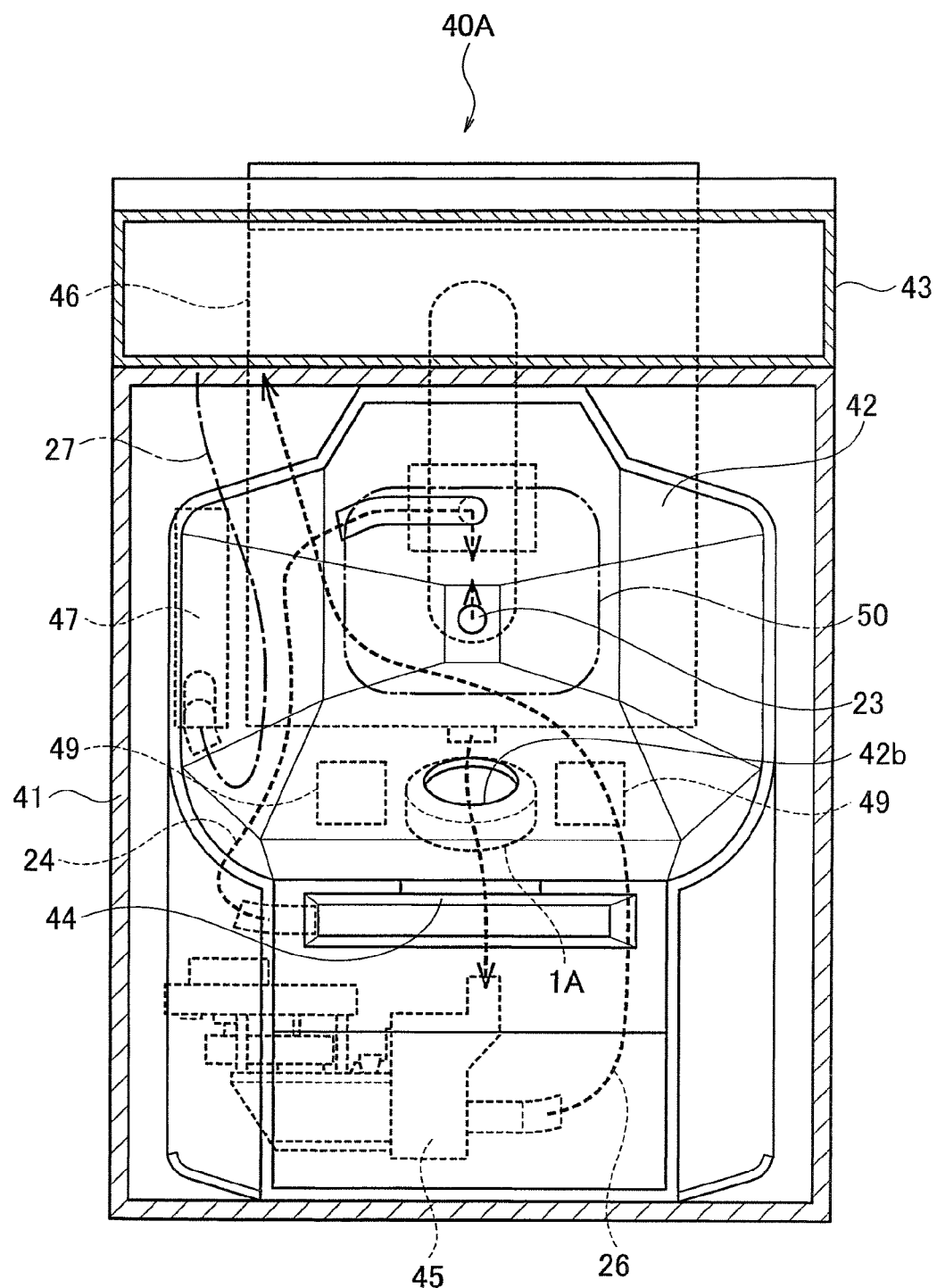
FIG. 11 is a cross-sectional view taken along the line B-B in FIG. 10.

The receiving plate 42 is formed into a concave shape along the shape of the head unit 51, and the bottom wall of the receiving plate 42 is provided with a through-hole 42b (refer to FIG. 10 and FIG. 11). A plasma generator 1A is provided on the back surface of the bottom wall of the receiving plate 42 in such a manner that the liquid storage section 4 communicates with the inner space of the receiving plate 42 via the through-hole 42b.

The plasma generator 1A according to the modified example fundamentally has approximately the same configuration as that of the plasma generator 1 according to the first embodiment. That is, the plasma generator 1A includes the case member 2, and the ceramic member (the partition) 3 is provided inside the case member 2 to divide the case member 2 into an upper area and a lower area.

Figure 9:
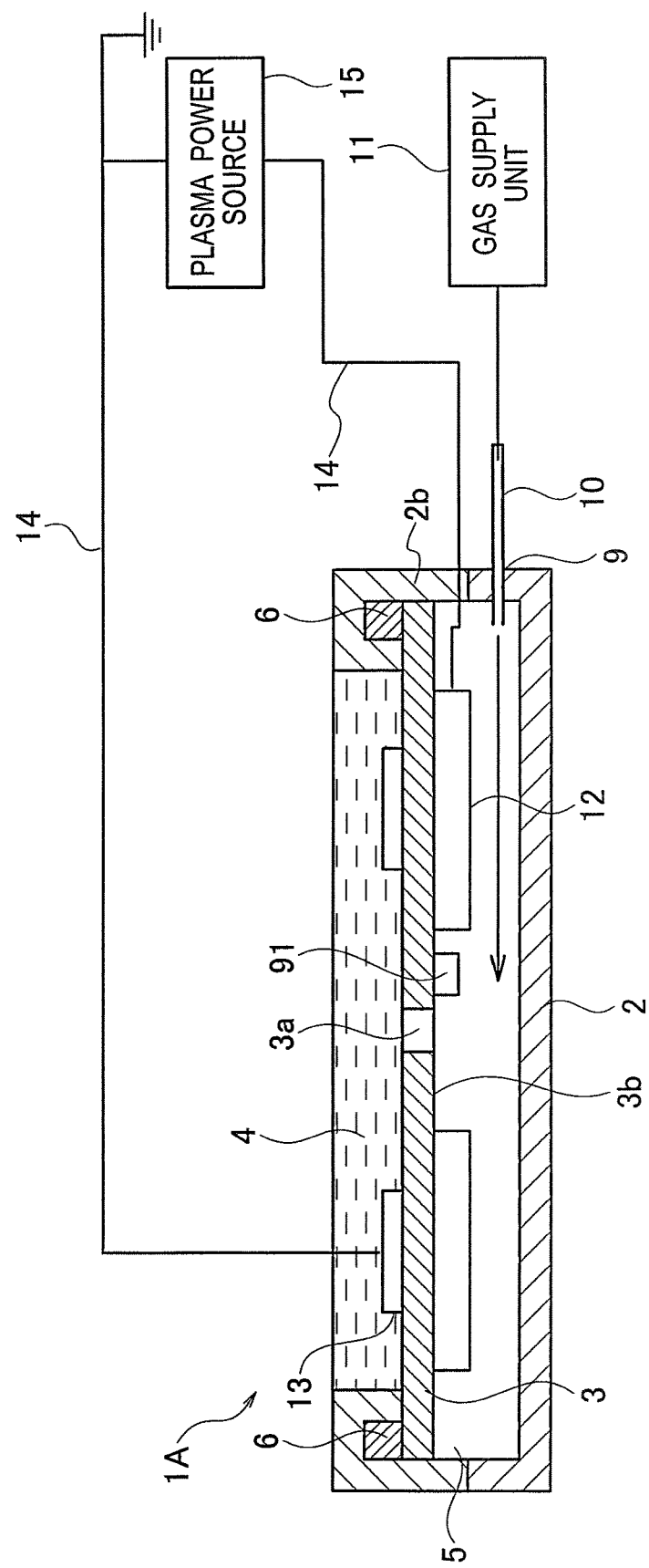
FIG. 9 is a view including a partial cross-section schematically showing a configuration of a plasma generator used in a small electrical appliance according to a modified example of the third embodiment of the present invention.

As shown in FIG. 9, the upper area in the inner space of the case member 2 divided by the ceramic member 3 serves as the liquid storage section 4 to store the liquid 17 containing water, and the lower area serves as the gas storage section 5 to store the gas.

The ring-shaped sealing member 6 is attached along the periphery of the liquid storage section 4 to seal a gap between the case member 2 and the ceramic member 3, so as to prevent the liquid 17 in the liquid storage section 4 from leaking from the gap between the case member 2 and the ceramic member 3 into the gas storage section 5.

The modified example differs from the third embodiment in that the liquid 17 in the liquid storage section 4 is not supplied to the inner space of the receiving plate 42 via the pipe (the liquid discharge passage) 22, but the plasma generator 1A is provided in such a manner that the liquid storage section 4 communicates with the inner space of the receiving plate 42, so that the inner space of the receiving plate 42 also functions as the liquid storage section 4 of the plasma generator 1A (that is, the inner space of the receiving plate 42 concurrently serves as the liquid storage section of the plasma generator).

Namely, the cleaning and purifying apparatus 40A as the small-sized appliance according to the modified example includes the plasma generator 1A, which includes the liquid storage section (the liquid storage section 4 and the inner space of the receiving plate 42) that stores the liquid containing water, the gas storage section 5 that stores the gas, and the partition 3 provided with the gas passage to introduce the gas inside the gas storage section 5 into the liquid storage section (the liquid storage section 4 and the inner space of the receiving plate 42), and separating the liquid storage section (the liquid storage section 4 and the inner space of the receiving plate 42) from the gas storage section 5.

In other words, the cleaning and purifying apparatus 40A as the small-sized appliance according to the modified example includes the liquid storage section (the liquid storage section 4 and the inner space of the receiving plate 42) that holds the head unit 51 as the cleaning treatment target section and stores the liquid containing water, and includes the gas storage section 5. The liquid storage section (the liquid storage section 4 and the inner space of the receiving plate 42) and the gas storage section 5 are defined by the partition 3.

Therefore, the second electrode 13 in the modified example is not required to be provided inside the liquid storage section 4 of the plasma generator 1A, but may be provided in the inner space of the receiving plate 42.

Although the modified example was exemplified by the case in which the partition 3 is provided separately from the bottom wall of the receiving plate 42, the partition 3 may be integrated with the bottom wall of the receiving plate 42. Namely, the bottom wall of the receiving plate 42 may also serve as the partition 3.

It is preferable to form, for example, drain grooves in the receiving plate 42 so as to discharge the liquid in the liquid storage 4 from the path 23 (the liquid discharge passage) more smoothly.

In the modified example, the pipe 21 corresponds to the liquid introduction passage of the cleaning and purifying apparatus, and the path 23 corresponds to the liquid discharge passage of the cleaning and purifying apparatus as described above.

Next, a performance of the cleaning and purifying apparatus 40A is explained.

First, the liquid is introduced into the receiving plate 42 and the liquid storage section 4 of the plasma generator 1A from the tank 43 via the pipe (the liquid introduction passage) 21.

The gas based on air and containing oxygen and with a predetermined flow rate, is delivered from the gas supply unit 11 to the gas storage section 5 via the pipe (the gas introduction passage) 10. Once the gas storage section 5 is shifted to a state of a positive pressure, a flow of the gas from the gas storage section 5 toward the liquid storage section 4 through the gas passage $3c$ is generated.

Then, a predetermined voltage is applied between the first electrode 12 and the second electrode 13 while the second electrode 13 is grounded so that electrical discharge is caused between the first electrode 12 and the second electrode 13. Due to the electrical discharge (the discharge caused between the surface of the first electrode 12 coming into contact with the gas and the surface of the second electrode 13 coming into contact with the liquid), plasma is produced in the gas region inside the liquid 17 in the liquid storage section 4, and ozone and hydroxyl radical are produced from water contained in the liquid 17 and oxygen contained in the gas (refer to FIG. 4).

The produced ozone and several types of radicals are delivered to the liquid stored in the liquid storage section 4 and the receiving plate 42 as a result of the gas flow described above. At this point, the fine gas bubbles being developed are released as the fine gas bubbles 16 into the liquid from the opening end $3c$, and the released fine gas bubbles 16 are dispersed in the liquid in all directions. Namely, the liquid thus obtained is supplied to the head unit 51 as the cleaning treatment target section 30. Thus, the organic substances attached to the head unit 51 can be resolved efficiently by the ozone or radical dissolved in the liquid (the cleaning liquid), or by the ozone or radical contained in the gas bubbles 16. Here, the gas bubbles being developed may be separated from the opening end $3c$ by the flow of the liquid in the liquid storage section 4 generated by the circulation of the liquid, so as to be released into the liquid. Alternatively, the gas bubbles 16 may be released naturally into the liquid by use of a phenomenon that gas bubbles are produced when passing through the small gas passage $3a$.

The modified example described above can also achieve the similar effects to the third embodiment.

Here, the predetermined voltage is applied between the first electrode 12 and the second electrode 13 while the second electrode 13 is grounded, so that a user is protected from electrical shock even if the user accidentally touches the liquid 17 or the second electrode 13. Accordingly, it is possible to significantly increase the safety of the cleaning and purifying apparatus 40a.

This configuration is effective especially in the case in which the second electrode 13 is provided in a non-enclosed state as in the case of the modified example.

Although the preferred embodiments of the present invention have been explained above, the present invention is not limited to the embodiments described above, and various modifications and improvements can be made within the scope of the present invention.

Although the respective embodiments were exemplified by the ceramic member as the partition provided with the gas passage, the material of the partition is not limited to the ceramic member. For example, the partition may be obtained in such a manner that an arbitrary member such as a glass plate to separate a gas from a liquid is prepared and subjected to photoengraving and etching processing so as to have fine pores having a size of approximately 1 µm to 10 µm.

The partition may be provided with plural gas passages.

The cleaning and purifying apparatus and the small-sized appliance are not particularly limited to those in the embodiments described above. For example, the present invention may be applied to, for example, a cleaning and purifying apparatus for an electrical toothbrush, a water filtration apparatus, and an apparatus for purifying water containing detergents before discharging.

The liquid storage section, the gas storage section, and the other particular specs (such as a figure, size and layout) can also be changed as necessary.

INDUSTRIAL APPLICABILITY

According to the present invention, it is possible to obtain the plasma generator capable of producing a radical quite stably, the method for producing the radical, and the cleaning and purifying apparatus and the small-sized electrical appliance using the same.

The invention claimed is:
1. A plasma generator, comprising:
a case member;
a liquid storage section that is provided inside the case member, and which stores a liquid containing water;

a gas storage section that is provided inside the case member, and which stores a gas;

a partition provided with a gas passage to introduce the gas in the gas storage section into the liquid storage section, the partition dividing the case member into an upper area and a lower area, and separating the liquid storage section from the gas storage section in such a manner that the liquid storage section is located in the upper area and the gas storage section is located in the lower area;

a doughnut-shaped first electrode provided in the gas storage section and positioned so as to have its center located on the gas passage;

a doughnut-shaped second electrode separated from the first electrode, the doughnut-shaped second electrode is positioned so as to have its center located on the gas passage, and is provided in such a manner that at least a portion coupled with the first electrode comes into contact with the liquid in the liquid storage section;

a gas supply unit that supplies a gas containing oxygen to the gas storage section so that the gas in the gas storage section is delivered under pressure into the liquid storage section via the gas passage; and a plasma power source that applies a predetermined voltage between the first electrode and the second electrode to cause electrical discharge between the first electrode and the second electrode, thereby converting the gas introduced into the gas storage section into plasma.

2. The plasma generator according to claim 1, wherein the plasma power source includes a voltage controller that controls the voltage applied between the first electrode and the second electrode.

3. The plasma generator according to claim 1, wherein the gas supply unit includes a gas type regulator that regulates a type of gas.

4. The plasma generator according to claim 1, wherein the gas supply unit functions to supply a gas in an atmosphere.

5. The plasma generator according to claim 1, wherein the gas supply unit includes a flow rate controller that controls a gas flow rate.

6. An electrical appliance comprising the plasma generator according to claim 1.

7. A cleaning and purifying apparatus, comprising:
the plasma generator according to claim 1;
a gas introduction passage fixed to the gas storage section to supply a gas to the gas storage section;
a liquid introduction passage for introducing a liquid to the liquid storage section, and a liquid discharge passage for discharging the liquid in the liquid storage section, the liquid introduction passage and the liquid discharge passage being fixed to the liquid storage section; and
wherein the gas supply unit supplies the gas from the gas introduction passage to deliver the gas in the gas storage section under pressure to the liquid storage section via the gas passage so as to release gas bubbles containing hydroxyl radical into the liquid.

8. The cleaning and purifying apparatus according to claim 7, wherein the liquid storage section is a liquid purifying section that purifies the introduced liquid by the hydroxyl radical contained in the gas bubbles.

9. The cleaning and purifying apparatus according to claim 7, wherein the liquid storage section is a cleaning liquid generator that releases the gas bubbles containing the hydroxyl radical into the liquid and thereby produces a cleaning liquid.

10. The cleaning and purifying apparatus according to claim 7, further comprising a position adjuster that adjusts a position of the plasma generator.

11. A small-sized appliance comprising the cleaning and purifying apparatus according to claim 7.

* * * * *